United States Patent
Danielson et al.

(10) Patent No.: US 6,850,002 B2
(45) Date of Patent: Feb. 1, 2005

(54) LIGHT EMITTING DEVICE FOR GENERATING SPECIFIC COLORED LIGHT, INCLUDING WHITE LIGHT

(75) Inventors: Earl Danielson, Palo Alto, CA (US); Andries Ellens, Munich (DE); Frank Jermann, Munich (DE); Wolfgang Rossner, Holzkirchen (DE); Martin Devenney, Mountain View, CA (US); Daniel Giaquinta, Mountain View, CA (US); Manfred Kobusch, Munich (DE)

(73) Assignees: Osram Opto Semiconductors GmbH, Regensburg (DE); Symyx Technologies Inc., Santa Clara, CA (US)

( * ) Notice: Subject to any disclaimer, the term of this patent is extended or adjusted under 35 U.S.C. 154(b) by 185 days.

(21) Appl. No.: 10/333,725

(22) PCT Filed: Jul. 27, 2001

(86) PCT No.: PCT/US01/23665

§ 371 (c)(1),
(2), (4) Date: Jan. 23, 2003

(87) PCT Pub. No.: WO02/11173

PCT Pub. Date: Feb. 7, 2002

(65) Prior Publication Data

US 2004/0124758 A1  Jul. 1, 2004

Related U.S. Application Data

(60) Provisional application No. 60/221,414, filed on Jul. 28, 2000.

(51) Int. Cl.$^7$ ................................................. H01J 33/00
(52) U.S. Cl. ............................... 313/501; 252/301.6 S; 362/84
(58) Field of Search ................................. 313/501, 507, 313/512, 486, 112; 362/84, 800, 257; 257/99, 100; 252/301.6 S, 301.4 S

(56) References Cited

U.S. PATENT DOCUMENTS

| | | | |
|---|---|---|---|
| 5,641,582 A | | 6/1997 | Nire et al. |
| 5,670,839 A | * | 9/1997 | Noma et al. ................ 313/503 |
| 5,813,752 A | | 9/1998 | Singer et al. |
| 5,847,507 A | | 12/1998 | Butterworth et al. |
| 6,090,200 A | | 7/2000 | Gray et al. |
| 6,153,123 A | | 11/2000 | Hampden-Smith et al. |
| 6,155,699 A | | 12/2000 | Miller et al. |
| 6,252,254 B1 | | 6/2001 | Soules et al. |

* cited by examiner

Primary Examiner—Vip Patel
Assistant Examiner—Glenn Zimmerman
(74) Attorney, Agent, or Firm—Frishauf, Holtz, Goodman & Chick, P.C.

(57) ABSTRACT

A device for the generation of specific colored light including white light by luminescent down conversion and additive color mixing based on a light-emitting diode (LED) comprising a semiconductor light-emitting layer emitting near UV light about 370–420 nm or blue light about 420–480 nm and phosphors which absorb completely or partly the light emitted by the light-emitting component and emit light of wavelengths longer than that of the absorbed primary light, wherein the light emitting layer of the light emitting component is preferably a Ga(In)N-based semiconductor; and at least one of the phosphors contains a metal sulfide fluorescent material activated with europium containing at least one element selected from the group consisting of Ba, Sr, Ca, Mg and Zn; and/or at least another phosphor which contains a complex thiometalate fluorescent material activated with either europium, cerium or both europium and cerium containing 1) at least one element selected from the group consisting of Ba, Sr, Ca, Mg and Zn and 2) at least one element selected from the group consisting of Al, Ga, In, Y, La and Gd.

29 Claims, 13 Drawing Sheets

LIGHT EMITTING DEVICE FOR GENERATING SPECIFIC COLORED LIGHT, INCLUDING WHITE LIGHT

This application is a U.S. National Phase Application under 35 USC 371 of International Application PCT/US01/23665 (published in English) filed Jul. 27, 2001 which claims the benefit of U.S. Provisional No. 60/221,414, filed Jul. 28, 2000.

FIELD OF INVENTION

The invention relates to a light emitting device and phosphors for the generation of specific, colored light, including white light, by luminescent down conversion and additive color mixing based on a light-emitting diode (LED) comprising a light-emitting semiconductor component which emits a primary light in the range of 370 to 480 nm and especially in the UV spectral range from about 370 to 415 nm, or in the blue spectral range from about 420 to 480 nm. The chip or a plurality of chips in a lighting unit is covered directly or indirectly by a phosphor or a combination of various phosphors, described as phosphor blends, which absorb completely or partly the primary light emitted by the light-emitting semiconductor component and emit a secondary light of wavelengths higher than that one of the primary light. The light-emitting semiconductor component is preferably a Ga(In)N-based semiconductor. The phosphors comprise at least a metal sulfide photoluminescent material MS activated with europium containing at least one element selected from the group M=Ba, Sr, Ca, Mg, Zn, and/or a complex thiometalate photoluminescent material $M^*N^*_2S_4$ activated with either europium, cerium or both, europium and cerium, containing at least one element selected from the group $M^*$=Ba, Sr, Ca, Mg, Zn, and at least one element selected from the group $N^*$=Al, Ga, In, Y, La, Gd.

In this disclosure, a phosphor blend is defined as any combination of two or more photoluminescent materials the output of which, in combination with the emission of the semiconductor, is capable of producing colored emission including white emission with a high color rendering index value or specific broad band or multi-band emission with defined color coordinates. Photophysical data regarding all of the above requirements have been investigated, and as a result a device may be fabricated in which the excitation/emission profiles of phosphors are optimally selected as required for a specific purpose.

DESCRIPTION OF RELATED ART

Solid state light sources based on light-emitting semiconductor components have been available for many years. Special interest is dedicated to light emitting diodes (LEDs) and to phosphors for converting primary light of a light emitting semiconductor component to longer wavelength, for example, for general purpose illumination as described, for example, in U.S. Pat. No. 5,998,925, WO 00/33390 and WO 00/33389.

U.S. Pat. No. 5,998,925 discloses a white light emitting LED device. It uses yttrium aluminum garnet doped with cerium, $Y_3Al_5O_{12}$:Ce, to convert blue emission of an InGaN-diode into yellow to produce white light of suitable color temperature. Another approach (WO 00/33390) uses a combination of a blue emitting LED together with a green and red phosphor. The phosphors are at least one of a first phosphor, among others thiogallates $(Sr,Ca,Ba)(Al,Ga)_2S_4:Eu^{2+}$, and at least one of a second phosphor, among others metal sulfide $SrS:Eu^{2+}$, or $(Ca,Sr)S:Eu^{2+}$, or thiogallate $CaLa_2S_4:Ce^{3+}$, to produce white light of distinct color temperature. The thiogallate $(Sr,Ca,Ba)(Al,Ga)_2S_4:Eu^{2+}$ can be used to generate specific colors together with light emitting elements such as blue LEDs, see WO 00/33389.

The above mentioned phosphors can be used to produce white light with various color temperatures and suitable index of color rendering by luminescent down conversion of primary LED emission, but they exhibit several drawbacks related to total conversion efficiency, absorption strength, emission wavelength tunability, thermal quenching characteristics and life time which are of high importance for using these phosphors in LEDs.

SUMMARY OF THE INVENTION

The object of the present invention is to provide a light emitting device having a light-emitting semiconductor component and a phosphor or a phosphor blend whereby the phosphors are capable of absorbing, with high efficiency, the primary light emitted by the light-emitting semiconductor component and emitting secondary light of wavelengths higher than that one of the primary light whereby secondary light emitted by the phosphors and primary light of the light-emitting semiconductor component may combine to generate light of any color, including white light.

Thus, the present invention provides a light-emitting device, comprising a light-emitting semiconductor component, emitting in the UV to blue spectral range between 370 and 480 nm, preferably between 370 and 415 nm or 420 to 480 nm, in combination with a phosphor or phosphor blend comprising at least one, preferably at least two, phosphors capable of absorbing at least a part of the primary light emitted by the light-emitting semiconductor component and emitting secondary light of wavelengths higher tan that one of the primary light. Said light-emitting semiconductor component comprises preferably a Ga(In,Al) N-based semiconductor. Said at least one phosphor comprises a photoluminescent metal sulfide MS (Type I phosphor) comprising at least one element selected from the group M=Ba, Mg, and Zn alone or in combination with at least one of Sr, Ca; the sulfide being activated with europium, or it comprises at least one phosphor comprising a complex metal thiometallate photoluminescent material $M^*N^*_2S_4$ (type II phosphor) comprised of at least one element selected from the group $M^*$=Mg, Zn, alone or in combination with at least one of Ba, Sr, Ca, and at least one element selected from the group $N^*$=Al, Ga, alone or in combination with In, Y, La, Gd, the thiogallate being activated with at least one of europium (Eu) and cerium (Ce).

Preferably at least one of type I and one of type II phosphor, possibly with addition of other well-known phosphors, can be combined to achieve a specific color (for example magenta) or even white light when irradiated by a LED emitting primary UV or blue light as specified above.

Beside the main characteristics, like spectral range of emission and absorption, and total conversion efficiency, additional important characteristics of the phosphors include 1) resistance to thermal quenching of luminescence at typical device operating temperatures (e.g. 80° C.); 2) lack of interfering reactivity with the encapsulating resins used in the device fabrication; 3) suitable absorptive profiles to minimize dead absorption within the visible spectrum; 4) a temporally stable luminous output over the operating lifetime of the device and; 5) compositionally controlled tuning of the phosphors excitation and emission properties.

In addition, the chemical compositions of the phosphors play a decisive role due to the composition dependent crystal field dependence of absorption, emission and conversion behavior of the optical 4f-5d transition of the emitting centers, $Eu^{2+}$ and $Ce^{3+}$ applied herein.

The invention also relates to phosphor compositions according to MS:Eu (type I phosphor) with M is at least one of M=Ba, Mg, Zn alone or in combination with Sr, Ca. This type of phosphor emits in the red spectral range of the visible spectrum and thus provides the red component in LEDs emitting specific colors or even white light.

In particular, the invention relates to specific phosphor compositions (type I phosphor) according to $(Sr_{1-x-y}M_xEu_y)S$ with M is at least one of =Ba, Mg, Zn alone or in combination with Ca and $0<x\leq0.5$ and $0<y\leq0.10$. Preferred are the binary compositions according to $(Sr_{1-x-y}Ba_xEu_y)S$ with $x<0.25$ and the ternary compositions according to $(Sr_{1-x-z-y}Ca_xBa_yEu_y)S$ with $x+y+z\leq0.35$ which exhibit a high quantum efficiency of 65–80%, high absorbance in the range from 370 nm to 470 nm of 60–80% and low loss, below 10%, of the luminescent lumen output from room temperature to 100° C. due to thermal quenching.

The invention also relates to phosphor compositions according to $M^*N^*_2S_4$:Eu,Ce (type II phosphor) with $M^*$ is at least one of $M^*$=Mg, Zn alone or together with at least one of Ba, Sr, Ca, and $N^*$ is at least one of $N^*$=Al, Ga, alone or together with small amounts (below 20%) of In, Y, La, Gd, which emits in the blue, green or green-yellow spectral range of the visible spectrum and thus can provide the blue, green or green-yellow component in LEDs emitting specific colors or even white light.

In particular, the invention relates to specific compositions (type II phosphor) containing Mg as one of the host lattice elements according to $(M^{**}_{1-u}Mg_u)(Ga_{1-v}N^*_v)_2S_4$:Ce with $u\leq0.75$ and $v\leq0.10$, and $M^{}$ is at least one of $M^{}$=Ba, Sr, Ca, Zn.

In particular, the invention relates to specific compositions (type II phosphor) according to $(M^{**}_{1-s-t}Eu_sCe_t)(Ga_{1-v}N^*_v)_2S_4$ with $M^{**}$ is at least one of =Mg, Zn alone or in combination with Sr, Ba, Ca, and $N^*$=Al, In, Y, La, Gd and $0<s\leq0.10$ and $0\leq t:s<0.2$ with $v\leq0.10$, which emit in green to green-yellow spectral range of the visible spectrum from 500 nm to 555 nm.

In particular, the invention relates to specific binary compositions (type II phosphor) according to $((Ba_{1-u}Mg_u)_{1-s-t}Eu_sCe_t)(Ga_{1-v}N^*_v)_2S_4$ with $u\leq0.75$ and $v\leq0.10$ and $0<s\leq0.10$ and $0s\leq t:s<0.2$ which emit in green spectral range of the visible spectrum from 500 nm to 540 nm and may exhibit a quantum efficiency above 75%, preferably above 80%, absorbance in the range from 320 nm to 460 nm of about 60% and low loss of the luminescent lumen output from room temperature to 100° C. below 7% due to thermal quenching.

In particular, the invention relates to specific ternary compositions (type II phosphor) according $(((Ba_{1-w}Ca_w)_{1-u}Mg_u)_{1-s-t}Eu_sCe_t)(Ga_{1-v}N^*_v)_2S_4$ with $u\leq0.75$ and $w\geq0.10$ and $v\leq0.10$ and $0<s\leq0.10$ and $0\leq t:s<0.2$, which emit in green-yellow spectral range of the visible spectrum from 525 nm to 535 nm and preferably exhibit a quantum efficiency above 80%, absorbance in the range from 320 nm to 410 nm above 60%, and low loss of the luminescent lumen output from room temperature to 100° C. below 15% due to thermal quenching.

In particular, the invention relates to specific ternary compositions (type II phosphor) according $(((Ba_{1-r}Sr_r)_{1-u}Mg_u)_{1-s-t}Eu_sCe_t)(Ga_{1-v}N^*_v)_2S_4$ with $u<0.75$ and $r\geq0.10$ and $v\leq0.10$ and $0<s\leq0.10$ and $0\leq t:s<0.2$, which emit in green-yellow spectral range of the visible spectrum from 525 nm to 535 nm and preferably exhibit a quantum efficiency above 60%, absorbance in the range from 320 nm to 410 nm above 60% and low loss of the luminescent lumen output from room temperature to 100° C. below 15% due to thermal quenching.

In particular, the invention relates to specific ternary compositions (type II phosphor) $(((Sr_{1-w}Ca_w)_{1-u}Mg_u)_{1-s-t}Eu_sCe_t)(Ga_{1-v}N^*_v)_2S_4$ with $u\leq0.75$ and $w\geq0.10$ and $v\leq0.10$ and $0<s\leq0.10$ and $t:s<0.2$ which emit in yellow-green spectral range of the visible spectrum from 535 nm to 555 nm and exhibit a quantum efficiency above 60%, absorbance in the range from 320 nm to 410 nm above 60% and low loss of the luminescent lumen output from room temperature to 100° C. below 15% due to thermal quenching.

In particular, the invention relates to specific ternary compositions (type II phosphor) $(((Sr_{1-p}Zn_p)_{1-u}Mg_u)_{1-s-t}Eu_sCe_t)(Ga_{1-v}N^*_v)_2S_4$ with $u<0.75$ and $p\leq0.35$ and $v\leq0.10$ and $0<s\leq0.10$ and $0\leq t:s<0.2$, which emit in green spectral range of the visible spectrum from 525 nm to 540 nm and exhibit a quantum efficiency of at least 60%, absorbance in the range from 370 nm to 420 nm above 60% and low efficiency reduction from room temperature to 100° C. below 15% due to thermal quenching.

The phosphors described and phosphor blends thereof which may comprise further additional phosphors well-known in the present state of the art can be used together with a light emitting semiconductor component, preferably a GaN-based LED, to achieve white light when excited by UV radiation or blue light of the LED. The achievable color temperatures cover a broad range of from 3000 to 6000° K. with a device luminous efficacy of up to 20 lumens per watt of input electrical powder and a color rendering index of typically more than 75, preferably more than 80.

The phosphors described and phosphor blends thereof which may comprise additional phosphors well-known in the present state of the art can be used together with a light emitting semiconductor component, preferably a GaN-based LED, are able to achieve colored light when excited by UV light or blue light covering a wide space of color coordinates ranging from $x=0.15–0.68$ and $y=0.05–0.82$.

BRIEF DESCRIPTION OF THE DRAWINGS

Other features and advantages of the invention will be apparent from the following detailed description and the accompanying drawings.

DETAILED DESCRIPTION OF PREFERRED EMBODIMENTS

Figure 1A:
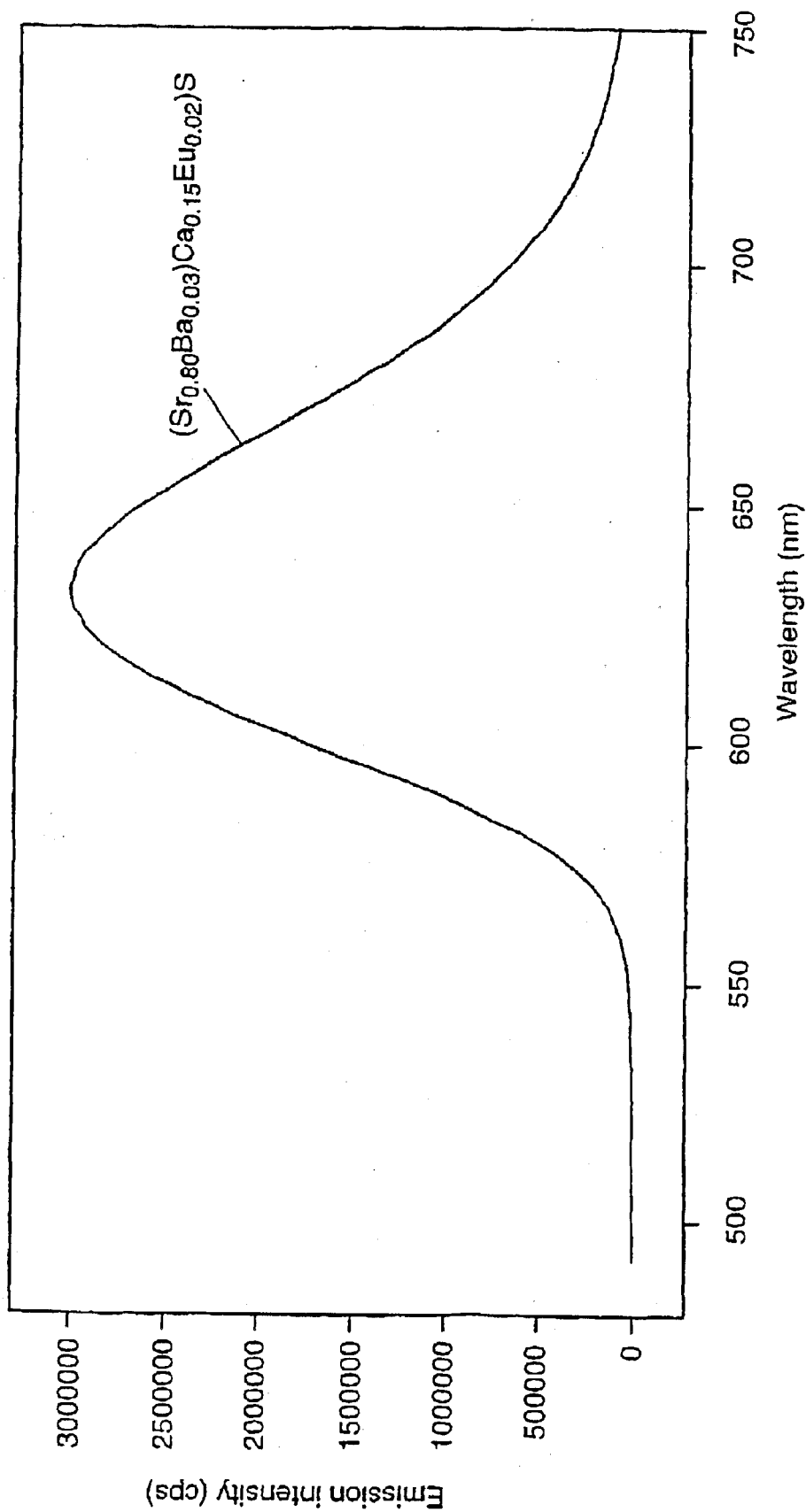
FIG. 1 discloses the photoluminescent emission spectrum of $(Sr_{0.80}Ba_{0.03}Ca_{0.15}Eu_{0.02})S$ (FIG. 1a) and of $((Sr_{0.77}Zn_{0.23})_{0.85}Mg_{0.10}Eu_{0.05})Ga_2S_4$(FIG. 1b)

The detailed construction of luminescence conversion based light emitting devices are shown for example in the prior art discussed above. Those or similar constructions, see for example U.S. Pat. No. 6,066,861, may be used. Emphasis is given in more detail to the phosphors and phosphor blends to be used in this invention.

The values of the quantum efficiency of luminescent down conversion are the ratio of the number of emitted photons to the number of absorbed photons. The quantum efficiency given in percent is determined by measuring the relative absorbance and the relative radiance compared to standard phosphors with known quantum efficiency. The used standard phosphors were $SrAl_2O_4$:Eu for 400 nm excitation and $Y_3Al_5O_{12}$:Ce for 460 nm excitation. The relative reflectance is measured in relation to a commercial $BaSO_4$-standard. The relative values given in percent for the optical absorbance of described phosphors corresponds directly to the mentioned values in percent for the optical reflectance, measured versus reflectance grade $BaSO_4$, by the relationship reflectance=100%-reflectance. The term high chromaticity used herein comprises features such as narrow lines and high color saturation. The content of the chemical elements in the described phosphor compositions are given in molar parts.

A first group of embodiments is directed to light emitting devices based on a light emitting semiconductor component which emits primary light in the near UV spectral range from 370–415 nm.

In this connection a preferred embodiment is related to a device for the generation of specific, colored light including white light by luminescent conversion and additive color mixing based on a light-emitting diode comprising a light-emitting component using a semiconductor as a light-emitting layer emitting a primary light in the range of 370–415 nm and phosphors which absorb at least a part of the primary light and emit light of longer wavelengths than the primary light, including red light, wherein the light-emitting layer of the light-emitting component is an Ga(In)N-based semiconductor and the red-emitting phosphor according to $(Sr_{1-x-y}M_xEu_y)S$ (type I phosphor) with M at least one of M=Ba, Mg, Zn alone or in combination with Ca, and $0<x\leq0.5$ and $0<y\leq0.10$ preferably the binary compositions according to $(Sr_{1-x-y}Mg_xEu_y)S$ or $(Sr_{1-x-y}Ba_xEu_y)S$ with $x\leq0.25$ and the ternary compositions according to $(Sr_{1-x-z-y}Ca_xBa_zEu_y)S$ with $x+y+z\leq0.35$. The red-emitting phosphor may be combined with a near UV (~400 nm) LED and a blue-emitting phosphor, a green emitting phosphor, both of the appropriate color, and when appropriate, a yellow-emitting phosphor for the production of specific colored light and more preferably for production of white light with a high color-rendering index of >80%.

Europium activated strontium sulfide, is a high chromaticity red phosphor excitable from the near UV (400 nm) to the blue-green (500 nm) with high quantum efficiency. For an optimized use of this phosphor for luminescent conversion of primary LED light it is necessary to modify the photophysical characteristics to achieve, for example, efficacy, color specifications and life time of related light emitting devices. The chromaticity and quantum efficiency of the europium activated strontium sulfide can be modified through the substitution of divalent metal ions for strontium from the list including Ba, Ca, Mg, and Zn.

The red emitting phosphor $(Sr_{1-x-y}M_xEu_y)S$ is prepared by mixing stoichiometric amounts of SrO, $Ba(OH)_2 \cdot 8H_2O$, CaO and $Eu_2O_3$. The mixture is then heated in an alumina crucible an nitrogen atmosphere up to 1000–1200° C., preferably to 1100° C. When the maximum temperature is achieved the mixture is reacted in a $H_2S$ flowing atmosphere for 1–4 hours, preferably for 2 hours. Another method for synthesis of $(Sr_{1-x-y}M_xEu_y)S$ uses commercially available sulfide precursors such as SrS and EuS. Stoichiometric amounts of binary sulfide were well ground using an agate mortar and pestle under either an ambient atmosphere or in an argon-filled glove box. After grinding, the powders were transferred to graphite crucibles and placed into a tube furnace under flowing Ar. The furnace was then purged at room temperature in flowing Ar for 6–12 hours. When the tube was fully purged, the furnace was ramped at 10°/minute to 150° C. where the temperature remained stable for 2 hours to more fully purge the furnace of water and oxygen. After the two hours was completed, the furnace was ramped at 5°/minute to 1250° C. where the temperature remained stable for 6 hours. After six hours the furnace was turned off and allowed to cool. When the furnace had reached room temperature, the sample was removed and finely ground. The sample was then returned to the furnace where the general procedure was repeated with the only alterations being that the sample was heated to 1300° C. for 12 hours. Samples were annealed for a total of 30–42 hours. Photophysical measurements were performed at the completion of each annealing step to monitor the progress of the reaction.

Figure 2A:
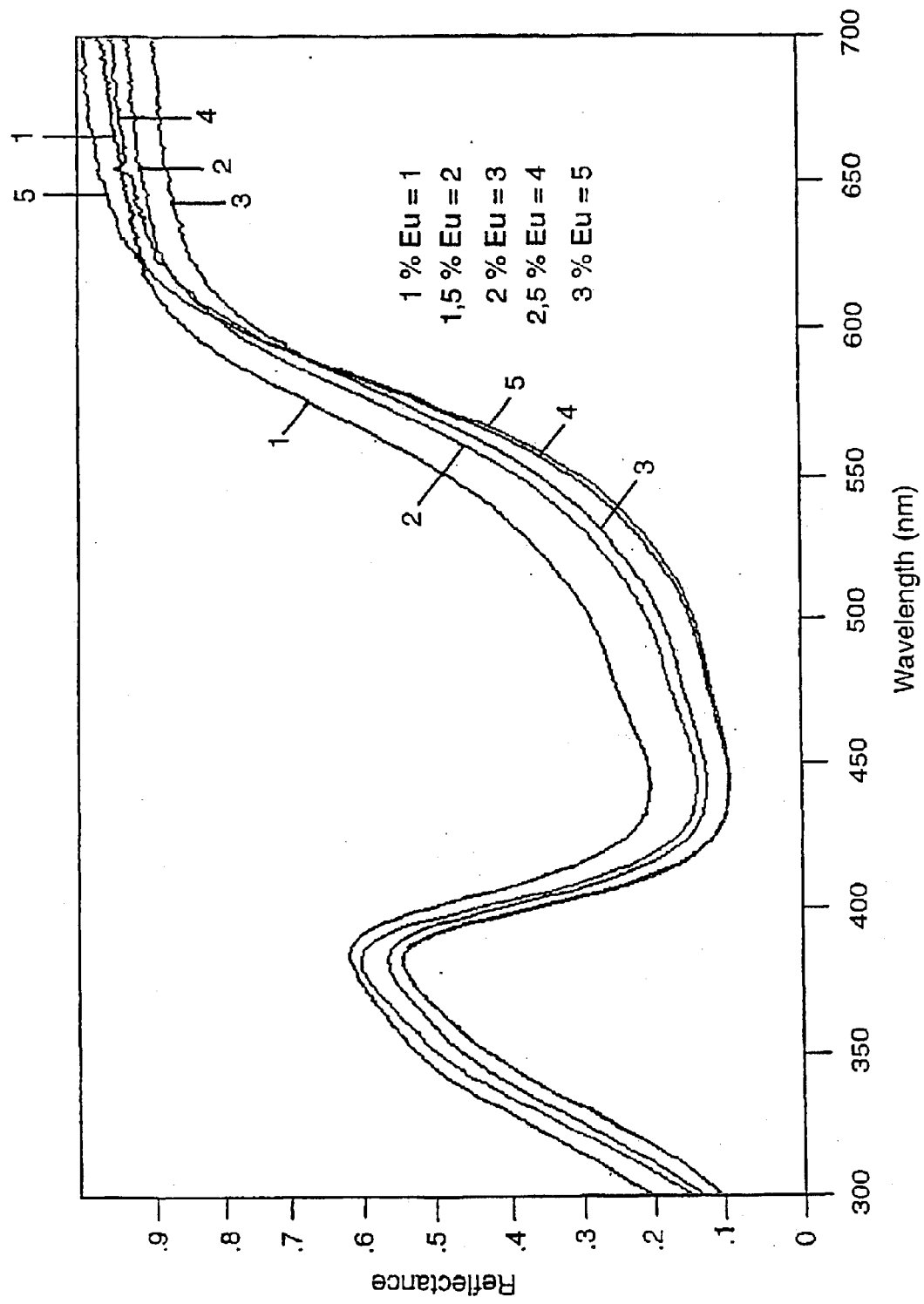
FIG. 2 discloses the reflection spectra of $(Sr_{0.82-x}Ba_{0.03}Ca_{0.15}Eu_x)S$ with various Eu content (FIG. 2a) and of $((Sr_{0.77}Zn_{0.23})_{0.85}Mg_{0.10}Eu_{0.05})Ga_2S_4$ (FIG. 2b)
Figure 3A:
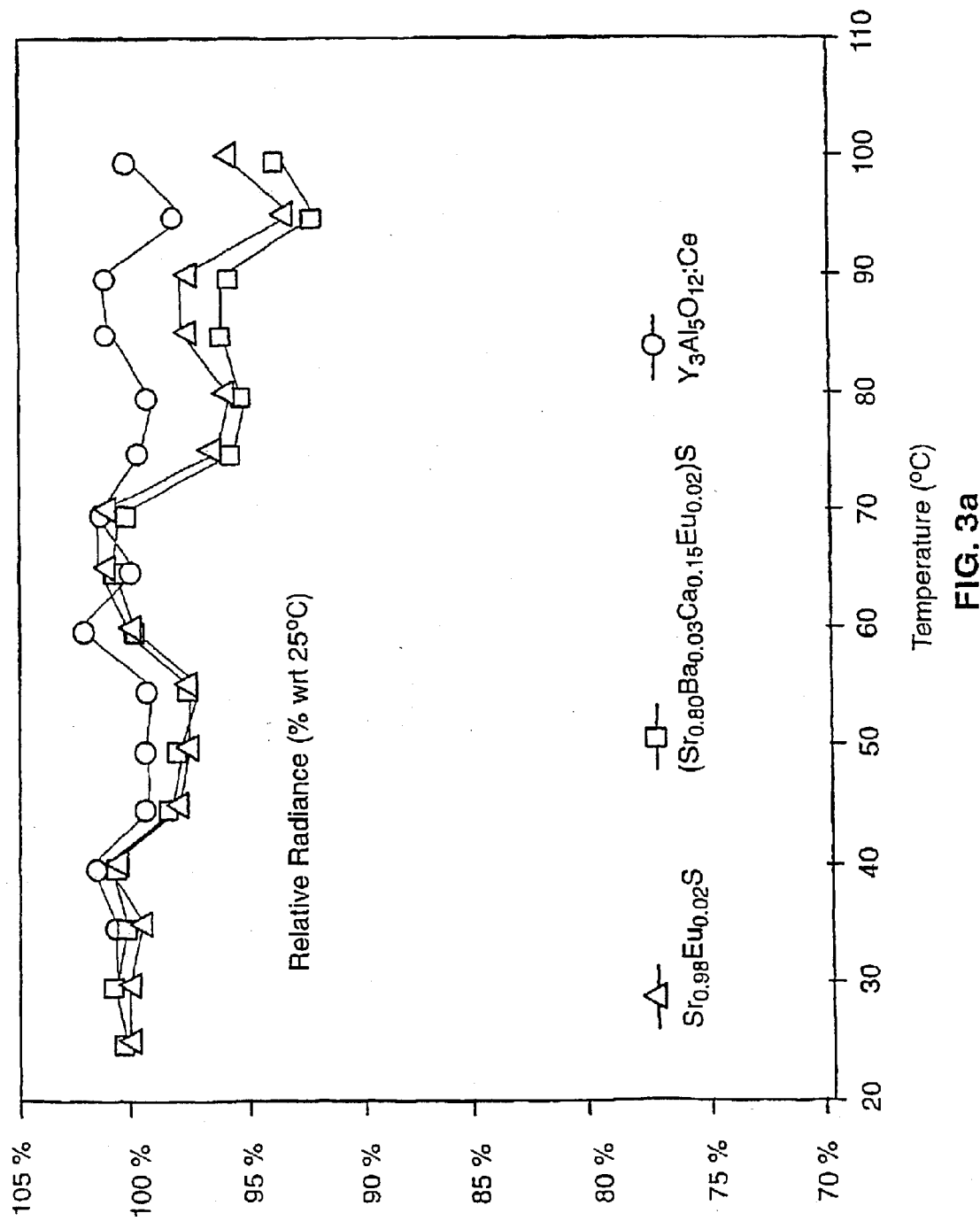
FIG. 3 discloses the thermal quenching of the photoluminescence of $(Sr_{0.80}Ba_{0.03}Ca_{0.15}Eu_{0.02})S$ and $Sr_{0.98}Eu_{0.02}S$ (FIG. 3a) and of $((Sr_{0.25}Ca_{0.75})_{0.45}Mg_{0.55}Eu_{0.05}Ga_2S_4$; $((Sr_{0.77}Zn_{0.23})_{0.85}Mg_{0.10}Eu_{0.05})Ga_2S_4$ and $((Sr_{0.85}Zn_{0.15})_{0.65}Mg_{0.30}Eu_{0.05})Ga_2S_4$(FIG. 3b)
Figure 3B:
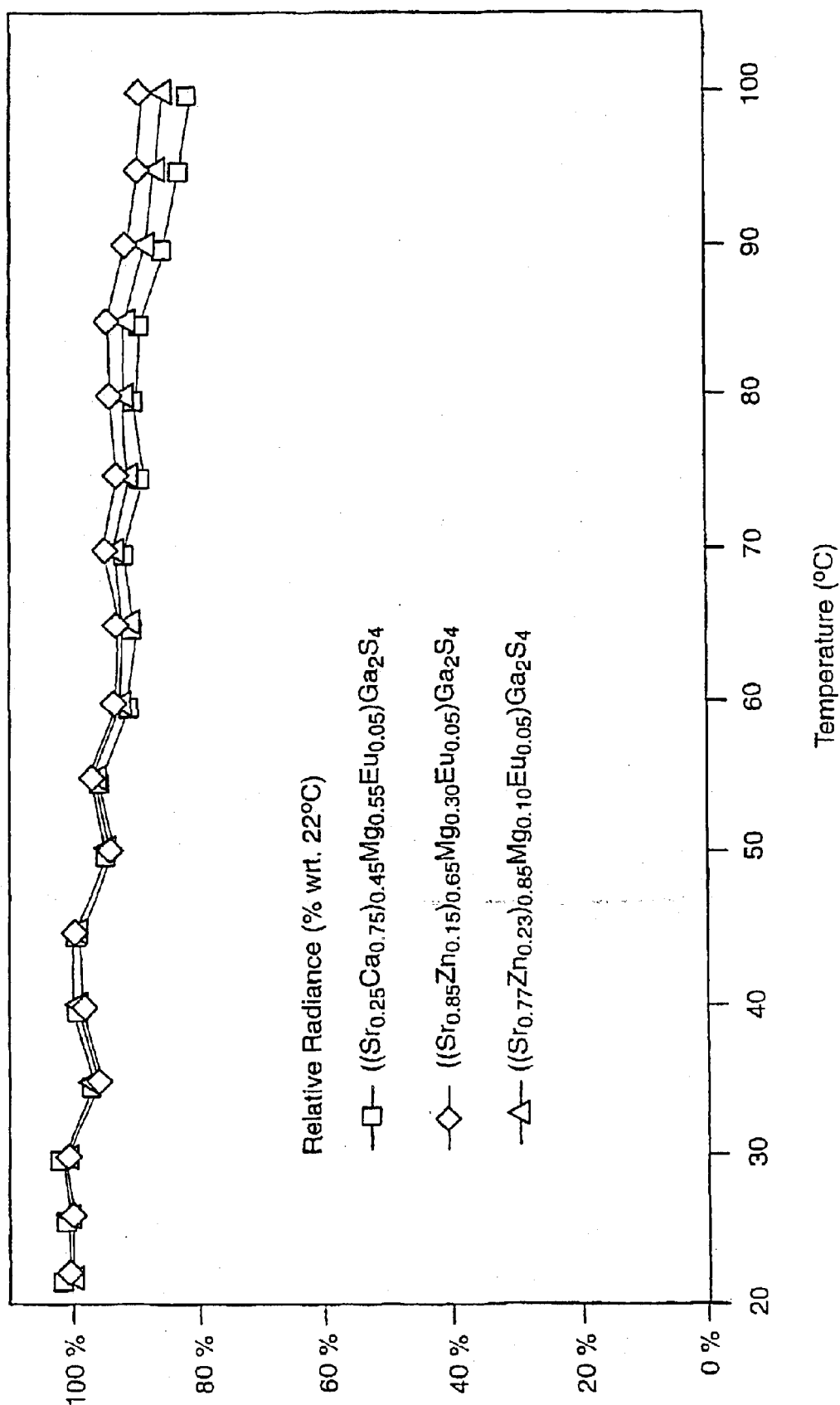

The photophysical characteristics of substituted europium activated strontium sulfide synthesized as described above are listed in the following Table I together with unsubstituted europium activated strontium sulfide. The photoluminescent emission spectrum for $(Sr_{0.80}Ba_{0.03}Ca_{0.15}Eu_{0.02})S$, excited at 400 nm, and reflectance spectra for $Sr_{0.82-x}Ba_{0.03}Ca_{0.15}Eu_x)S$ with various Eu content are shown in FIG. 1a and FIG. 2a. SrS activated with 1% europium vs. 2% europium, for example, displays a dramatically different body color and consequently different absorption and reflectance characteristics. Loss in luminescent output due to thermal quenching is consistently less than 10% at temperatures of 100° C. and higher compared to room temperature, given arbitrarily as 100% (FIG. 3a). X-ray diffraction (FIG. 4) displays the presence of only single phase materials crystallizing in the expected NaCl structure with the expected lattice parameter shifts for a given substitution. Loss in luminescent output due to thermal quenching is consistently less than 10% at temperatures of 100° C. and higher compared to room temperature.

TABLE I

Photophysical characteristics for various $(Sr_{1-x-y-z}Ba_xCa_zEu_y)S$ phosphors excited at 400 nm

| Composition | Emission Wavelength (Peak) nm | Reflectance at 400 nm % | Quantum Efficiency % |
|---|---|---|---|
| $(Sr_{0.81}Ba_{0.03}Ca_{0.15}Eu_{0.01})S$ | 630 | 50 | 59 |
| $(Sr_{0.805}Ba_{0.03}Ca_{0.15}Eu_{0.015})S$ | 632 | 44 | 72 |
| $(Sr_{0.80}Ba_{0.03}Ca_{0.15}Eu_{0.02})S$ | 632 | 45 | 71 |
| $(Sr_{0.795}Ba_{0.03}Ca_{0.15}Eu_{0.025})S$ | 632 | 37 | 67 |
| $(Sr_{0.79}Ba_{0.03}Ca_{0.15}Eu_{0.03})S$ | 632 | 35 | 62 |
| $(Sr_{0.98}Eu_{0.02})S$ | 618 | 52 | 69 |

Referring to the use of near UV radiation as a primary light source a preferred embodiment is related to a device for the generation of specific, colored light including white light as described above using phosphors which absorb at least a part of the primary light and emit light of longer wavelengths than the primary light, including green and yellow light, wherein the green to green-yellow-emitting complex metal sulfide photoluminescent materials are according to $M^*N^*_2S_4$:Eu,Ce (type II to phosphor) with $M^*$=Mg, Zn alone or in combination with Ba, Sr, Ca, and N*=Al, Ga, alone or in combination with In, Y, La, Gd, preferably compositions according to $(M^*_{1-s-t}Eu_sCe_t)(Ga_{1-v}N^*_v)_2S_4$ with N*=Al, In, Y, La, Gd and $0<s\leq0.10$ and $t:s<0.2$ with $v\leq0.10$, preferably binary compositions according to $((Ba_{1-u}Mg_u)_{1-s-t}Eu_sCe_t)(Ga_{1-v}N^*_v)_2S_4$ with $u\leq0.75$ and $v\leq0.10$ and $0<s\leq0.10$ and $t:s<0.2$ and ternary compositions according to $(((Sr_{1-w}Ca_w)_{1-u}Mg_u)_{1-s-t}Eu_sCe_t)(Ga_{1-v}N^*_v)_2S_4$ with $u\leq0.75$ and $w\geq0.10$ and $v\leq0.10$ and $0<s\leq0.10$ and $t:s<0.2$ as well as $(((Ba_{1-r}Sr_r)_{1-u}Mg_u)_{1-s-t}Eu_sCe_t)(Ga_{1-v}N^*_v)_2S_4$ with $u<0.75$ and $r\geq0.10$ and $v\leq0.10$ and $0<s\leq0.10$ and $t:s<0.2$ as well as $(((Sr_{1-w}Ca_w)_{1-u}Mg_u)_{1-s-t}Eu_sCe_t)(Ga_{1-v}N^*_v)_2S_4$ with $u\leq0.75$ and $w\geq0.10$ and $v\leq0.10$ and $0<s\leq0.10$ and $t:s<0.2$ as well as $(((Sr_{1-p}Zn_p)_{1-u}Mg_u)_{1-s-t}Eu_sCe_t)(Ga_{1-v}N^*_v)_2S_4$ with $u<0.75$ and $p\leq0.35$ and $v\leq0.10$ and $0<s\leq0.10$ and $t:s<0.2$. These green to green-yellow-emitting phosphor may be combined with a near UV (~400 nm) LED and a blue-emitting phosphor, a red emitting phosphor, both of the appropriate color for the production of specific colored light and more preferably for production of white light with a high color-rendering index of >80.

Europium and/or cerium activated, substituted strontium thiogallate, is a high chromaticity green to yellow phosphor excitable from the near UV(400 nm) to the blue-green (480 nm), preferably 420 to 480 nm, with high efficiency. For an optimized use of these phosphors for luminescent conversion of primary LED light it is necessary to modify the photophysical characteristics to meet, for example, efficacy, color specifications and life time of related light emitting devices. The chromaticity and quantum efficiency of the substituted strontium thiometalate may be modified through the substitution of divalent metal ions for strontium from the list including Ba, Ca, Mg, and Zn and/or the substitution of trivalent metal ions for gallium from the list including Al, In, Y, La, and Gd.

These green to green-yellow emitting phosphors are prepared by the following technique: High purity nitrates, oxalates and acetates were dissolved with stirring in 25–30 ml deionized water. The solutions are stirred with heating on a hot-plate until the water has evaporated resulting in a white or yellow paste, depending on composition. The solids are dried overnight (~12 hours) at 120° C. followed by 12 hours at 550° C. The resulting solid is finely ground and placed into a high purity alumina crucible. The crucibles are loaded into a tube furnace and purged with flowing Ar for several hours. The furnace parameters are 10° C./min to 900° C., followed by a 6 hour dwell at 900° C. after which the furnace is turned off and allowed to cool to, room temperature. $H_2S$ is introduced to the furnace only after the temperature has reached 800° C. and is turned off when the furnace has cooled to 800° C. The samples are once again finely ground before analysis. Additional time at temperature and in $H_2S$ may be required after the initial reaction, however this is dependent on composition. Luminous output may be improved through an additional anneal at slightly lower temperatures in flowing argon.

Figure 1B:
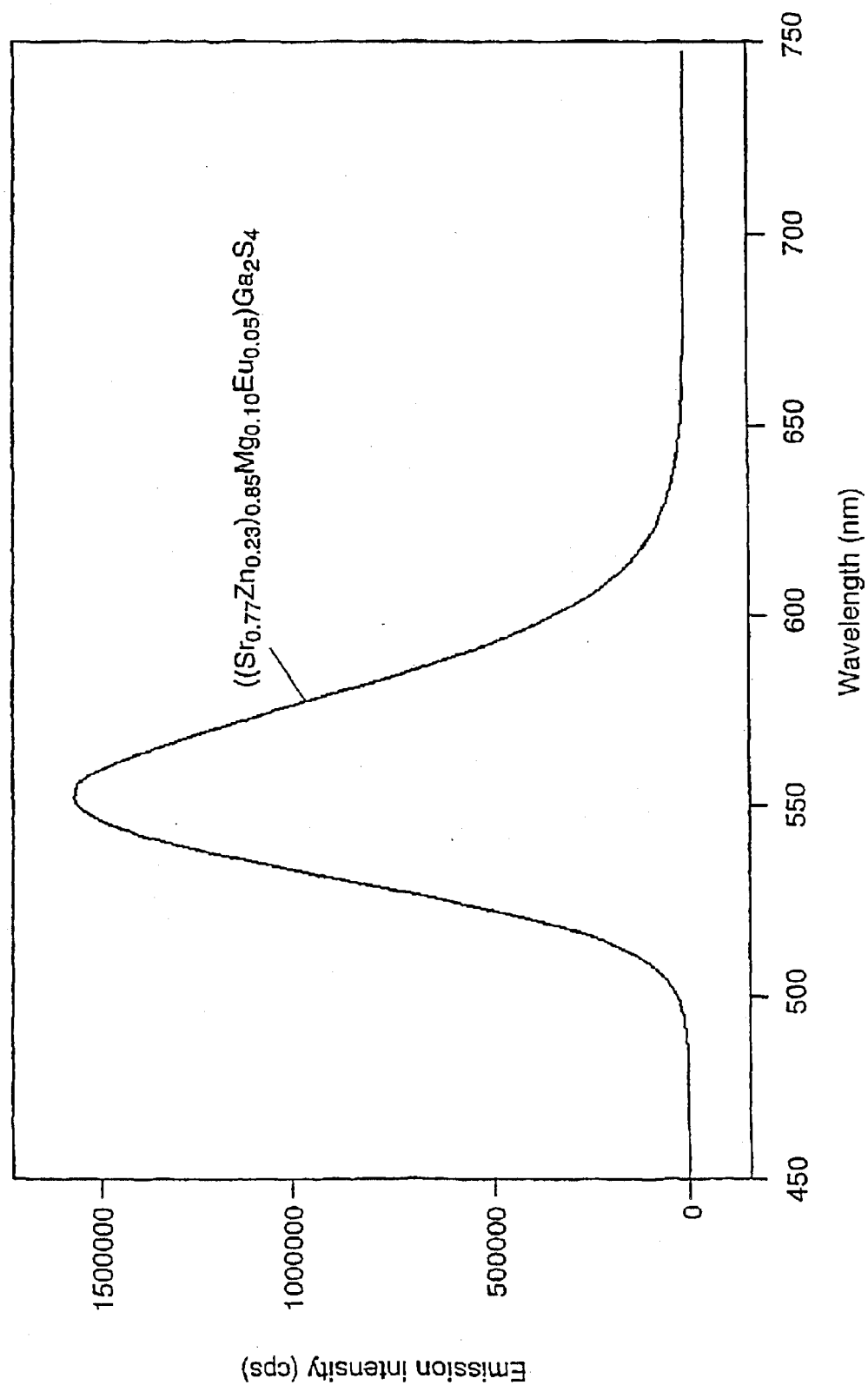
Figure 2B:
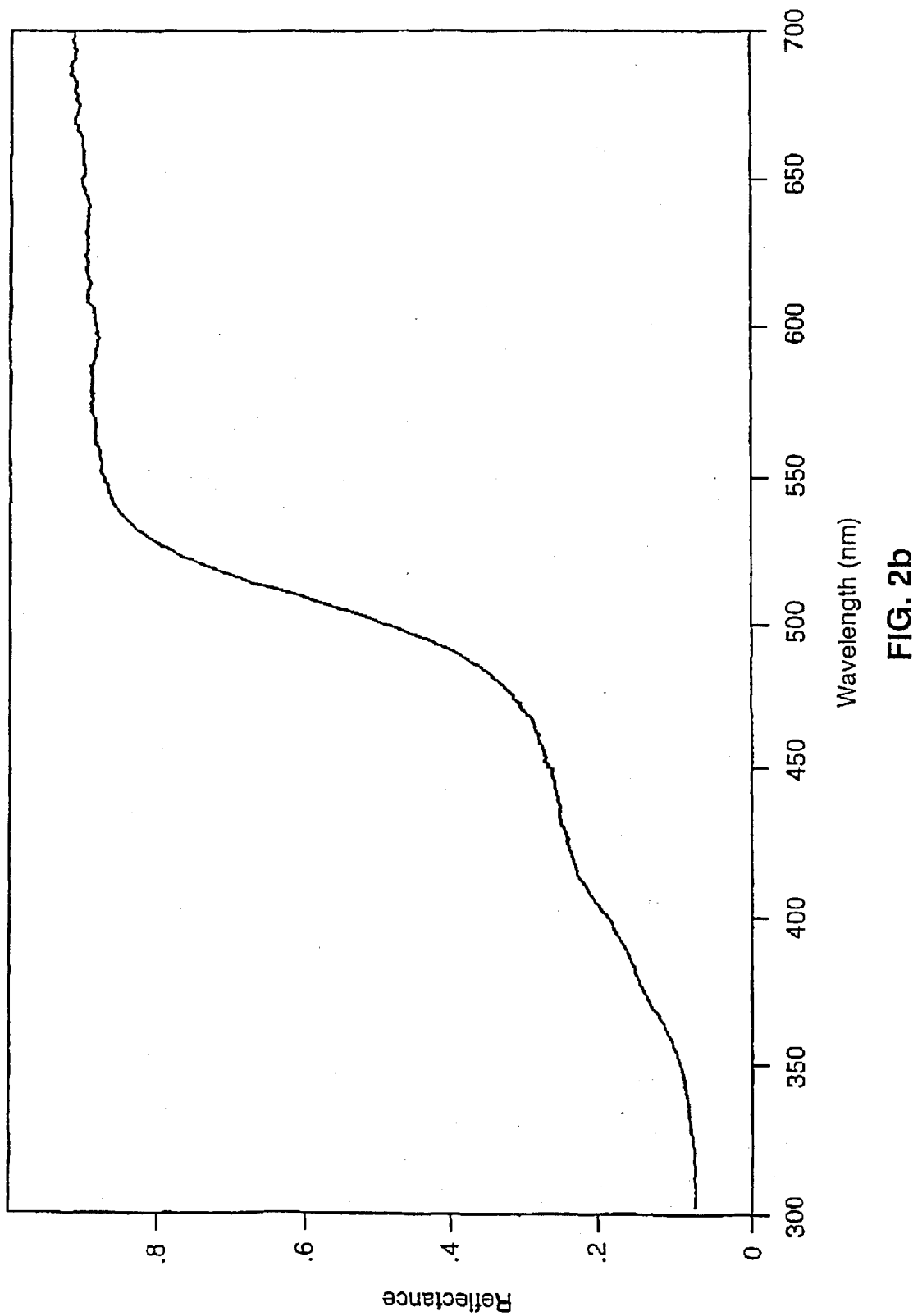

Examples of the photophysical characteristics of substituted europium activated thiogallates are listed in Table II. The photoluminescent emission spectrum for $((Sr_{0.77}Zn_{0.23})_{0.85}MgO_{0.10}Eu_{0.05})Ga_2S_4$, excited at 400 nm, and related reflectance spectrum are shown in FIG. 1b and FIG. 2b. X-ray diffraction is consistent with the structure of $SrGa_2S_4$ with certain small deviations of position and intensity due to the substitution of smaller divalent metal ions for strontium. Loss in luminescent output due to thermal quenching is consistently less than 1.5% at temperatures of 100° C. and higher compared to room temperature (FIG. 3a).

TABLE II

Photophysical characteristics for various $(M^*_{1-s}Eu_s)Ga_2S_4$ phosphors excited at 400 nm with M* = Ba, Mg, Sr, Ca, Zn

| Composition | Emission Wavelength (Peak) nm | Reflectance at 400 nm % | Quantum Efficiency % |
|---|---|---|---|
| $(Ba_{0.80}Mg_{0.15}Eu_{0.05})Ga_2S_4$ | 509 | 29 | 63 |
| $(Ba_{0.38}Mg_{0.57}Eu_{0.05})Ga_2S_4$ | 533 | 28 | 69 |
| $((Sr_{0.25}Ca_{0.75})_{0.40}Mg_{0.55}EU_{0.05})Ga_2S_4$ | 533 | 20 | 80 |
| $((Ba_{0.57}Ca_{0.43})_{0.40}Mg_{0.55}EU_{0.05})Ga_2S_4$ | 548 | 18 | 82 |
| $((Sr_{0.25}Ba_{0.75})_{0.40}Mg_{0.55}EU_{0.05})Ga_2S_4$ | 536 | 23 | 72 |
| $((Sr_{0.77}Zn_{0.23})_{0.85}Mg_{0.10}EU_{0.05})Ga_2S_4$ | 538 | 27 | 73 |
| $((Sr_{0.85}Zn_{0.15})_{0.65}Mg_{0.30}EU_{0.05})Ga_2S_4$ | 535 | 14 | 68 |
| $((Sr_{0.05}Mg_{0.05}Ba_{0.90})_{0.98}Ce_{0.02})Ga_2S_4$ | 455 | 36 | 69 |

Referring to the use of near UV radiation as primary light source a preferred embodiment is related to a device for the generation of specific, colored light including white light as described above using phosphors which absorb at least a part of the primary light and emit light of longer wavelengths than the primary light, including blue light, wherein the blue-emitting complex metal sulfide photoluminescent materials are according to according to $((Ba_{1-r}Sr_r)_{1-u}Mg_u)_{1-t}Ce_t)(Ga_{1-v}N_v)_2S_4$ with $0<t\leq0.10$ and $u\leq0.25$ and $r\leq0.95$ and $v=0.10$ This blue-emitting phosphor may be combined with a near UV (~400 nm) LED and green-emitting phosphor, yellow-emitting phosphor and a red-emitting phosphor of the appropriate color and if appropriate for the production of specific colored light and more preferably for production of white light with a high color-rendering index of >80%.

This blue emitting phosphor is synthesized following the techniques described for complex metal sulfide photoluminescent materials according to $M^*N^*_2S_4$:Eu,Ce (type II phosphor). An example for the photophysical characteristics is given in Table II.

Another embodiment with relation to the phosphors of the first group of embodiments is a light emitting device comprising the combination of a 400 nm emitting GaN-based LED together with a phosphor blend containing a blue emitting $(MgSrBa)Ga_2S_4$:Ce phosphor, a green emitting $(CaSrBa)Ga_2S_4$:Eu phosphor and a red emitting (CaBaSr) S:Eu phosphor with the corresponding spectral weight ratio blue:green:red=1.1:2.4:2.18 which emits white light with color coordinates x=0.336 and y=0.339 and index of color rendering of 83 and a lumen output of about 21 lumen/Watt.

A second group of embodiments is directed to light emitting devices based on a light emitting semiconductor component which emits primary light in the blue spectral range from 420 to 480 nm.

The preferred embodiments for the second group are the same as for the first group of embodiments in relation to the applied light emitting semiconductor component and phosphors except the blue emitting phosphor according to $((Ba_{1-r}Sr_r)_{1-u}Mg_u)_{1-t}Ce_t)(Ga_{1-v}N_v)_2S_4$. Due to the broad absorption band of the 4f–5d-transition of $Eu^{2+}$ the described phosphors exhibit suitable absorption or low reflectance in the disclosed spectral range from 370 nm to 480 nm for the primary light emitted by the light emitting semiconductor component.

A preferred embodiment of the second group is a red-emitting phosphor according to $(Sr_{1-x-y}M_xEu_y)S$ (type I phosphor) with M=Ba, Mg, Zn, alone or in combination with Ca, and $0<x\leq 0.5$ and $0<y\leq 0.10$ preferably the binary compositions according to $(Sr_{1-x-y}Mg_xEu_y)S$ or $(Sr_{1-x-y}Ba_xEu_y)S$ with $x\leq 0.25$ and the ternary compositions according to $(Sr_{1-x-z-y}Ca_xBa_zEu_y)S$ with $x+y+z\leq 0.35$. The red-emitting phosphor may be combined with a blue 460 nm LED and at least a green emitting phosphor of the appropriate color, and when appropriate, a yellow-emitting phosphor for the production of specific colored light and more preferably for production of white light with a high color-rendering index of >80.

The synthesis of this red phosphor may follow the techniques as already described for the first group of embodiments and can be modified by similar compositional substitutions as described there for achieving optimized photophysical characteristics to meet the required device specifications.

Achieved values for the photophysical properties are listed in table III in relation to the conversion of primary light of 460 nm.

TABLE III

Photophysical characteristics for various $(Sr_{1-x-y-z}Ba_xCa_zEu_y)S$ phosphors excited at 460 nm

| Composition | Emission Wavelength (Peak) nm | Reflectance at 460 nm % | Quantum Efficiency % |
|---|---|---|---|
| $(Sr_{0.81}Ba_{0.03}Ca_{0.15}Eu_{0.01})S$ | 630 | 21 | 76 |
| $(Sr_{0.805}Ba_{0.03}Ca_{0.15}Eu_{0.015})S$ | 632 | 15 | 79 |
| $(Sr_{0.80}Ba_{0.03}Ca_{0.15}Eu_{0.02})S$ | 632 | 13 | 77 |
| $(Sr_{0.795}Ba_{0.03}Ca_{0.15}Eu_{0.025})S$ | 632 | 10 | 71 |
| $(Sr_{0.79}Ba_{0.03}Ca_{0.15}Eu_{0.03})S$ | 632 | 10 | 65 |
| $(Sr_{0.98}Eu_{0.02})S$ | 618 | 21 | 75 |

Another preferred embodiment of the second group are green to green-yellow emitting phosphors according to $M^*N^*_2S_4$:Eu,Ce (type II phosphor) with $M^*$=Mg, Zn alone or in combination with Ba, Sr, Ca, and $N^*$=Al, Ga, In, Y, La, Gd, preferably compositions according to $(M^*_{1-s-t}Eu_sCe_t)(Ga_{1-v}N_v)_2S_4$ with $N^*$=Al, In, Y, La, Gd and $0\leq s\leq 0.10$ and $t:s<0.2$ with $v\leq 0.10$, preferably binary compositions according to $((Ba_{1-u}Mg_u)_{1-s-t}Eu_sCe_t)(Ga_{1-v}N_v)_2S_4$ with $u\leq 0.75$ and $v\leq 0.10$ and $0.1\leq s\leq 0.10$ and $t:s<0.2$ and ternary compositions according to $(((Sr_{1-w}Ca_w)_{1-u}Mg_u)_{1-s-t}Eu_uCe_t)(Ga_{1-v}N_v)_2S_4$ with $u\leq 0.75$ and $w\geq 0.10$ and $v\leq 0.10$ and $0<s\leq 0.10$ and $t:s<0.2$ as well as $(((Ba_{1-r}Sr_r)_{1-u}Mg_u)_{1-s-t}Eu_sCe_t)(Ga_{1-v}N_v)_2S_4$ with $u<0.75$ and $r\geq 0.10$ and $v\leq 0.10$ and $v\leq 0.10$ and $0\leq s\leq 0.10$ and $t:s<0.2$ as well as $(((Sr_{1-w}Ca_w)_{1-u}Mg_u)_{1-s-t}Eu_sCe_t)(Ga_{1-v}N_v)_2S_4$ with $u\leq 0.75$ and $w\geq 0.10$ and $v\leq 0.10$ and $0<s\leq 0.10$ and $t:s<0.2$ as well as $(((Sr_{1-p}Zn_p)_{1-u}Mg_u)_{1-s-t}Eu_sCe_t)(Ga_{1-v}N_v)_2S_4$ with $u<0.75$ and $p\leq 0.35$ and $v\leq 0.10$ and $0<s\leq 0.10$ and $t:s<0.2$. These green to green-yellow-emitting phosphor may be combined with a blue emitting (~460 nm) LED and at least a red emitting phosphor of the appropriate color for the production of specific colored light and more preferably for production of white light with a high color-rendering index of >80.

TABLE IV

Photophysical characteristics for various $(M^*_{1-s}Eu_s)Ga_2S_4$ phosphors excited at 460 nm with $M^*$ = Ba, Mg, Sr, Ga, Zn

| Composition | Emission Wavelength (Peak) nm | Reflectance at 400 nm % | Quantum Efficiency % |
|---|---|---|---|
| $(Ba_{0.38}Mg_{0.57}Eu_{0.05})Ga_2S_4$ | 509 | 40 | 75 |
| $((Sr_{0.25}Ca_{0.75})_{0.40}Mg_{0.55}Eu_{0.05})Ga_2S_4$ | 533 | 32 | 88 |
| $((Ba_{0.57}Ca_{0.43})_{0.40}Mg_{0.55}Eu_{0.05})Ga_2S_4$ | 548 | 31 | 76 |
| $((Sr_{0.77}Zn_{0.23})_{0.85}Mg_{0.10}Eu_{0.05})Ga_2S_4$ | 538 | 32 | 72 |
| $((Sr_{0.85}Zn_{0.15})_{0.65}Mg_{0.30}Eu_{0.05})Ga_2S_4$ | 535 | 25 | 65 |

Figure 4A:
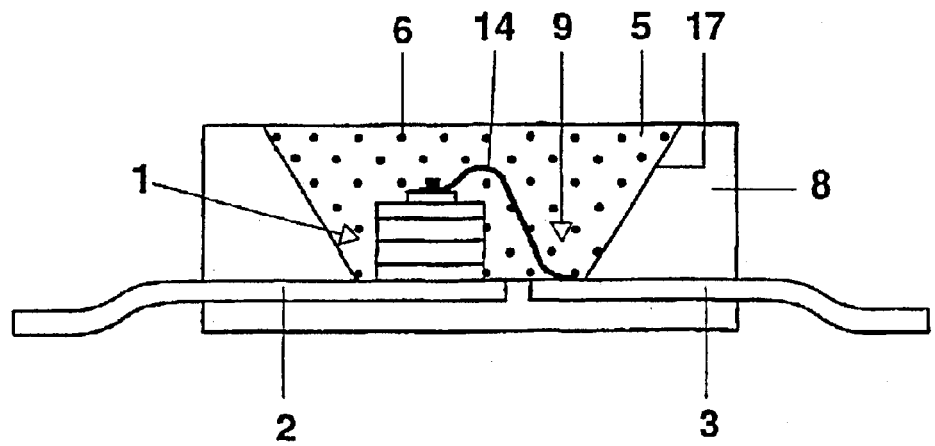
FIG. 4 discloses a light emitting device using one of said phosphors, with a first embodiment (FIG. 4a) and a second embodiment (FIG. 4b)

Another embodiment with relation to the phosphors of the second group of embodiments is a light emitting device comprising the combination of a 460 nm emitting GaN-based LED together with a phosphor blend containing a green emitting $(Y,Lu)_3Al_5O_{12}$:Ce phosphor and a red emitting (CaBaSr)S:Eu phosphor with the corresponding spectral weight ratio blue:green:red=1.95:1.0:0.9 which emits white light with color coordinates x=0.333 and y=0.337 and index of color rendering of 80 and a lumen output of about 27 lumen/Watt. As a specific example FIG. 4a shows a light emitting device with a chip 1 of InGaN-type, with a peak emission of 460 nm with a first and second electrical lead 2,3, and with a housing 8 having a cavity 9. One of the leads is connected to the chip via a bond wire 14. A wall 17 serves as a reflecting contour for the emitted radiation. The cavity is filled with a translucent resin 5, comprising epoxy and phosphor pigments 6. The phosphor is a blend as outlined above.

Another embodiment with relation to the phosphors of the second group of embodiments is a light emitting device comprising the combination of a 460 nm emitting GaN-based LED together with a phosphor blend containing a green emitting $(SrMgZn)Ga_2S_4$:Eu phosphor and a red emitting (CaBaSr)S:Eu phosphor with the corresponding spectral weight ratio blue:green:red=1.0:0.4:0.35 which emits white light with color coordinates x=0.333 and y=0.336 and index of color rendering of 84 and a lumen output of about 25 lumen/Watt.

Figure 4B:
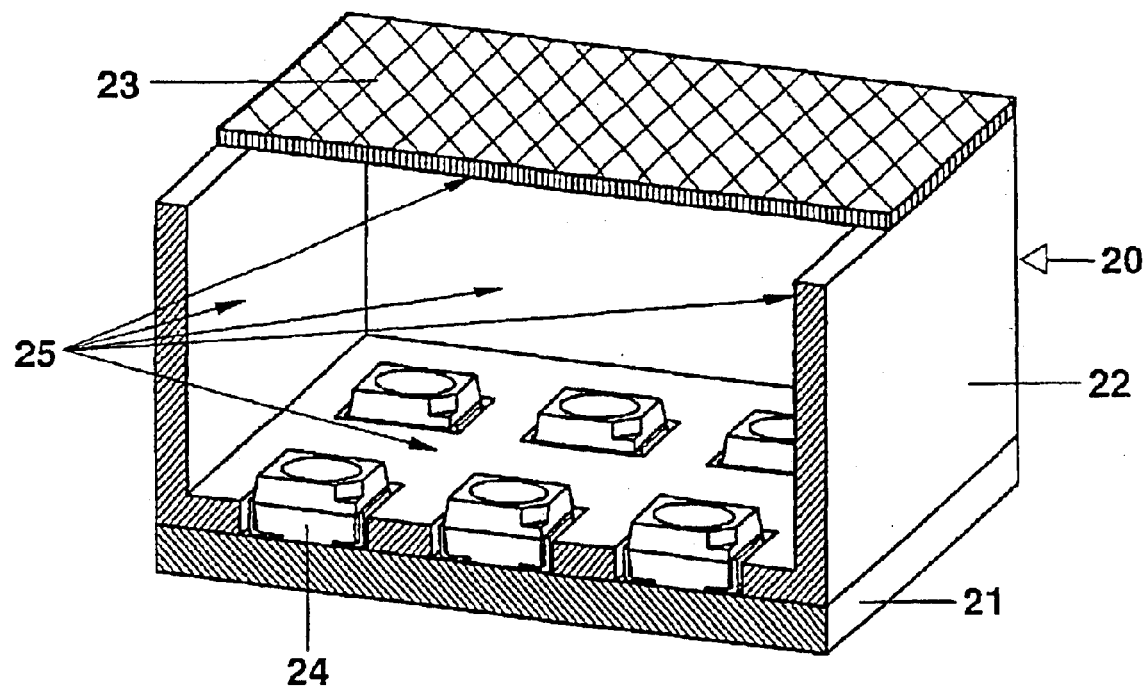
Figure 5A:
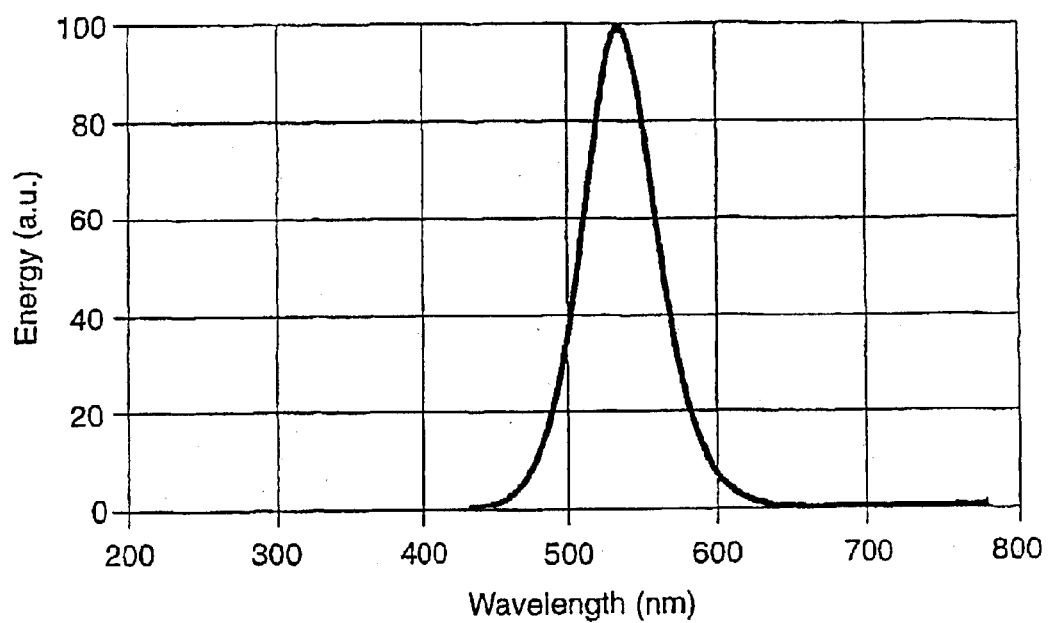
FIGS. 5 to 10 discloses the emission and reflectance spectra of various further phosphors in accordance with the invention.
Figure 5B:
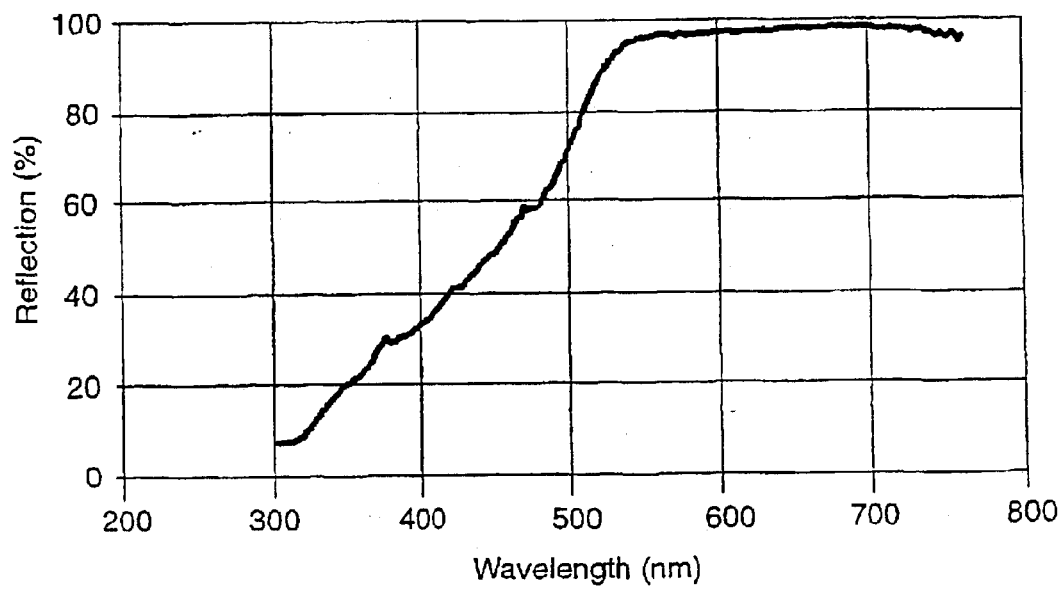
Figure 6A:
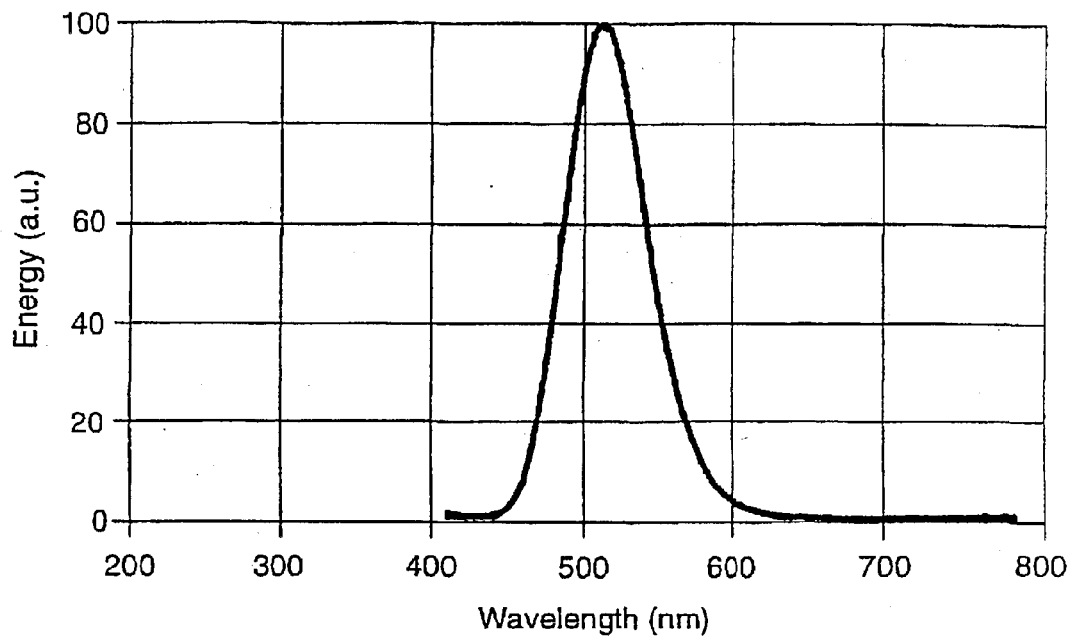
Figure 6B:
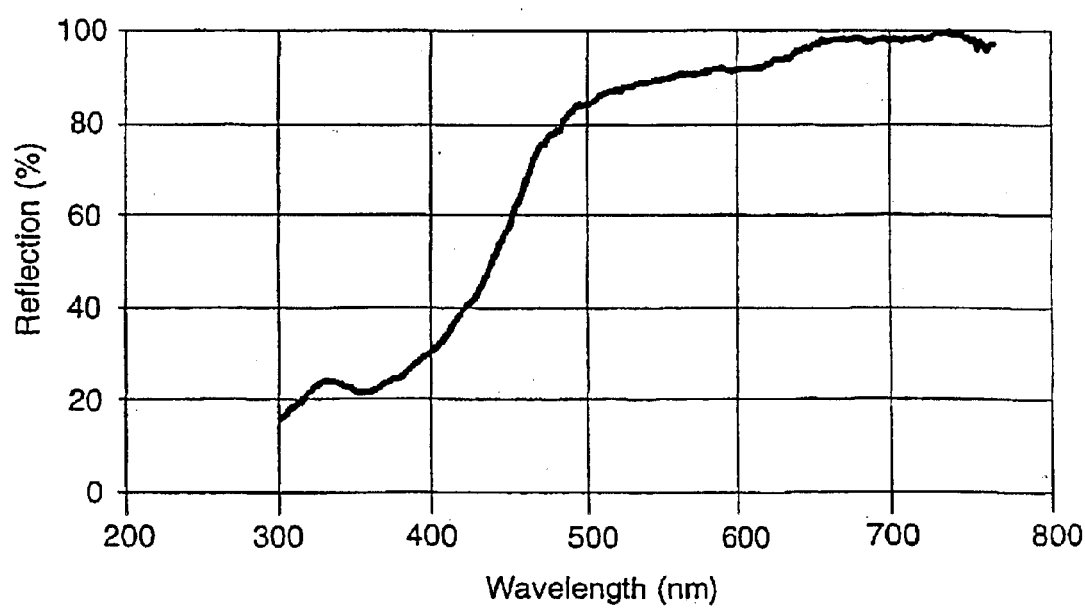
Figure 7A:
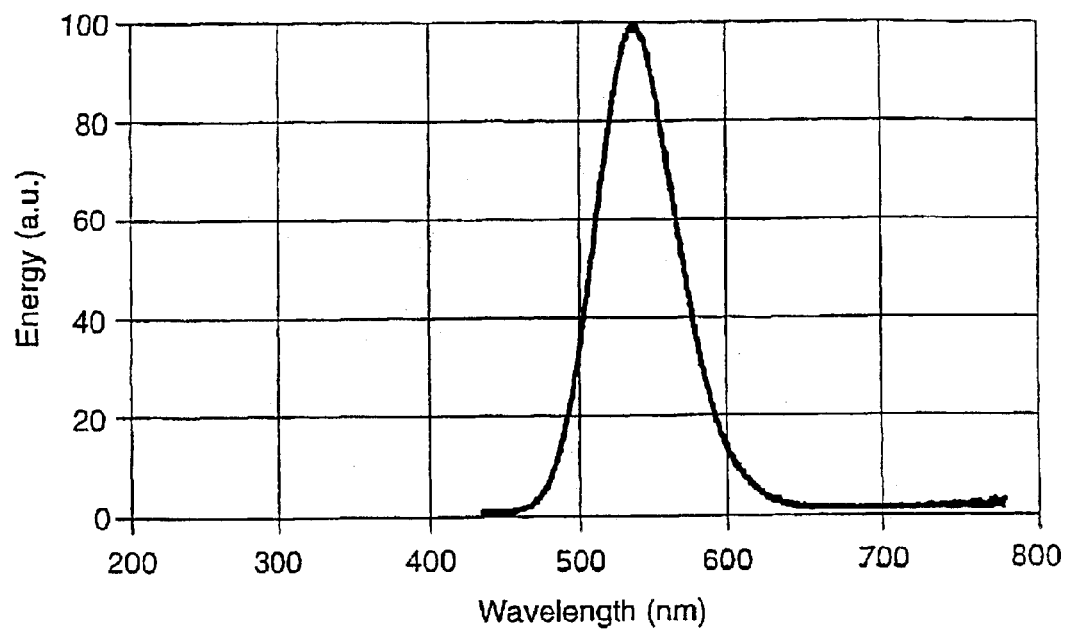
Figure 7B:
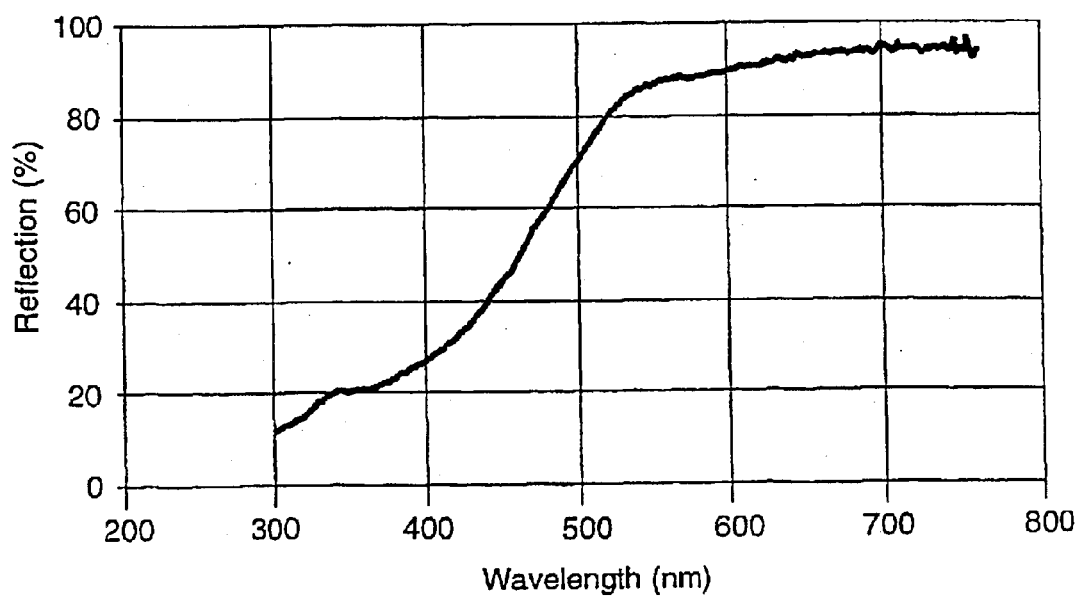
Figure 8A:
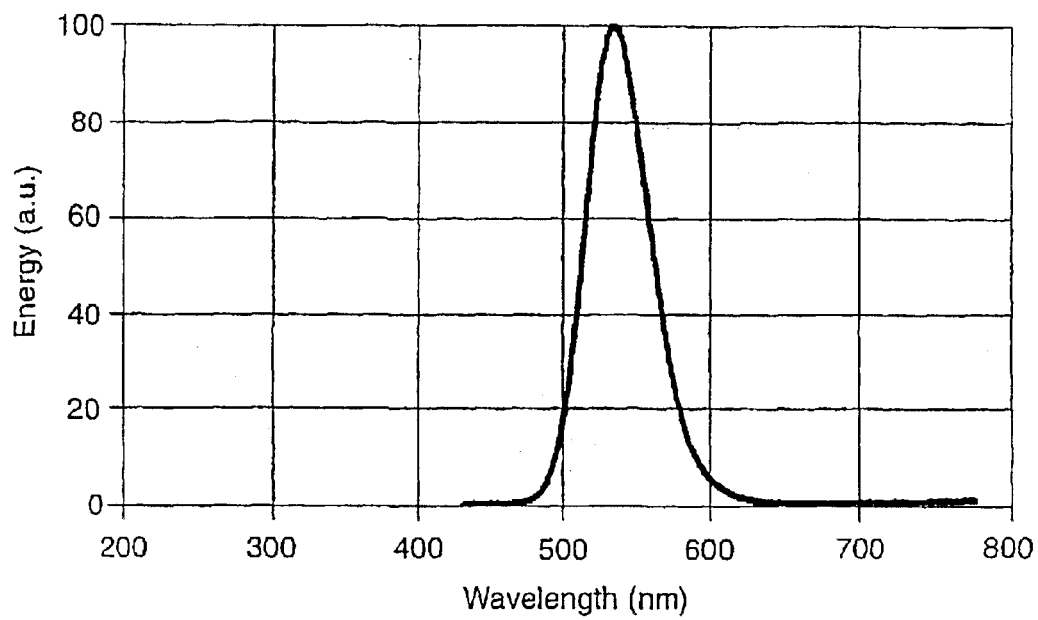
Figure 8B:
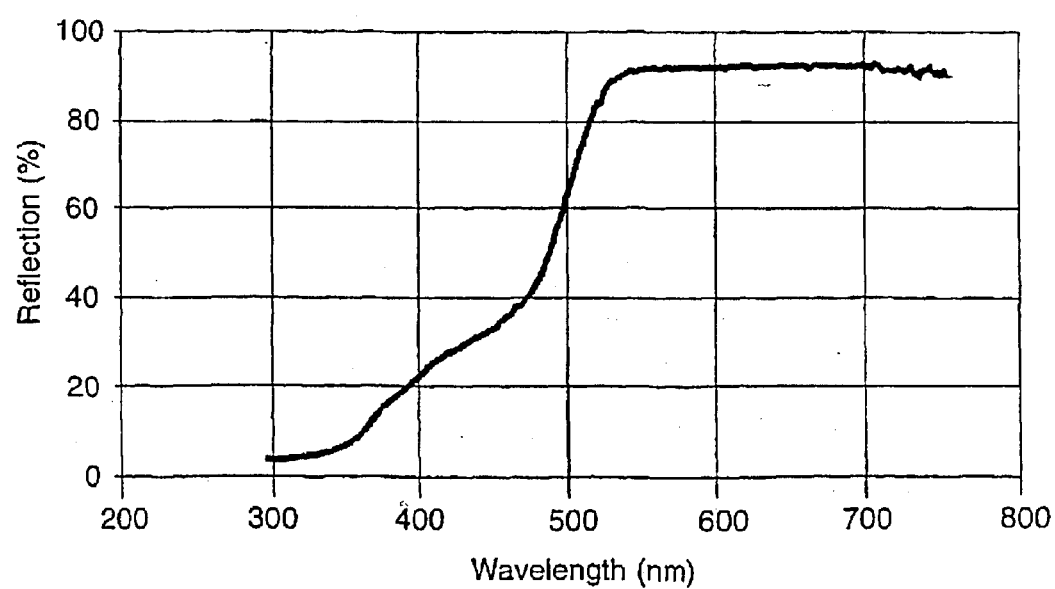
Figure 9A:
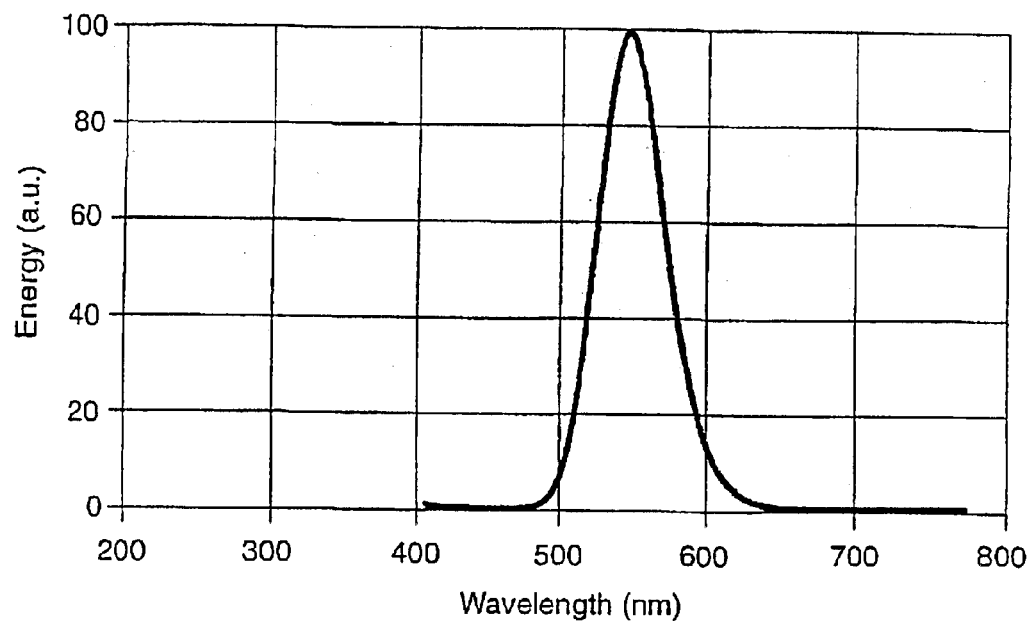
Figure 9B:
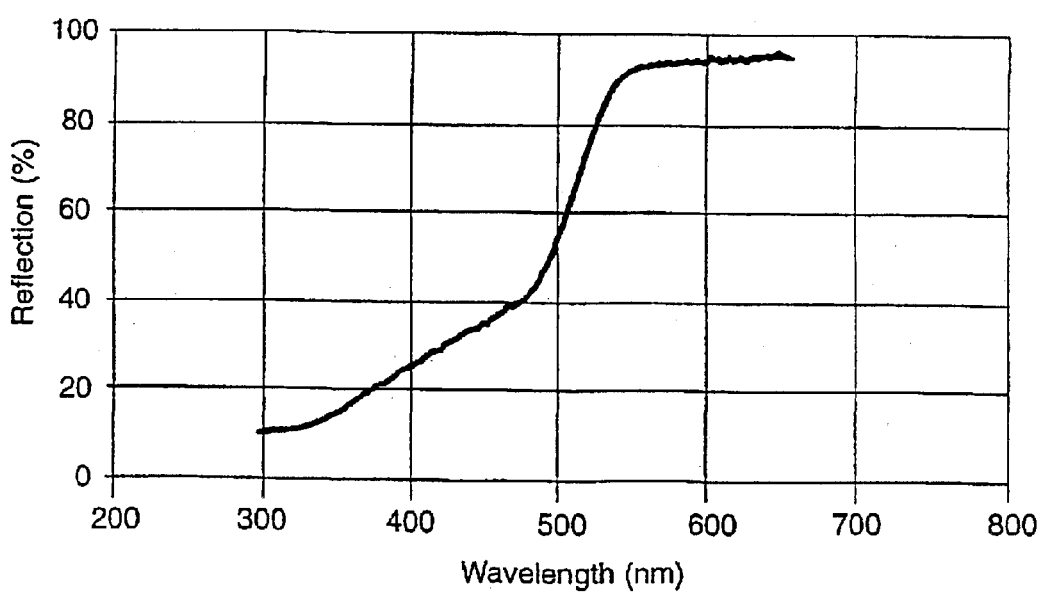
Figure 10A:
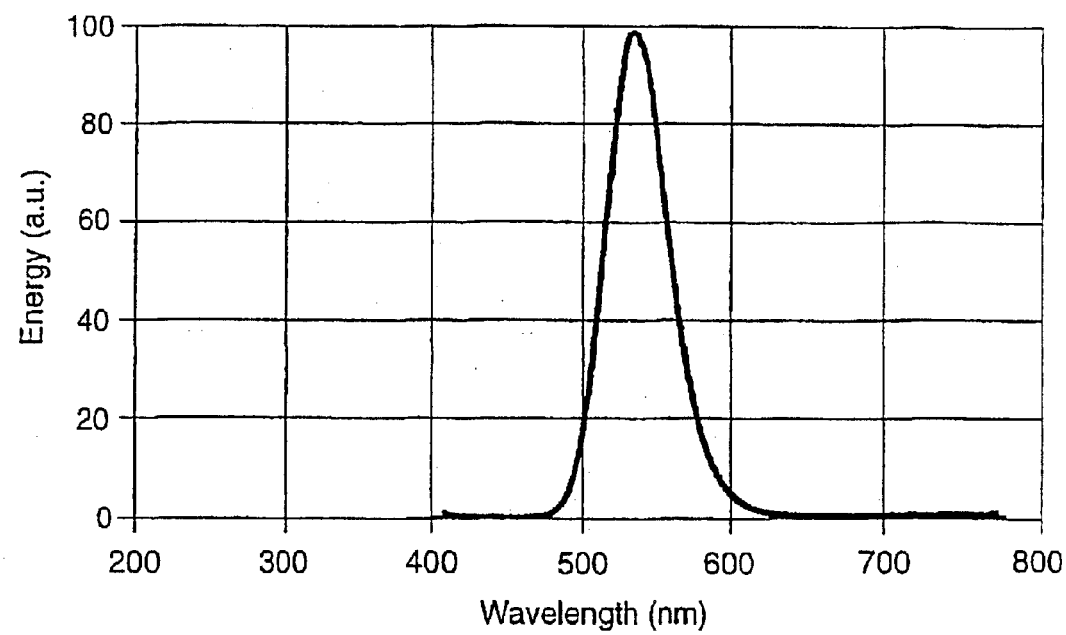
Figure 10B:
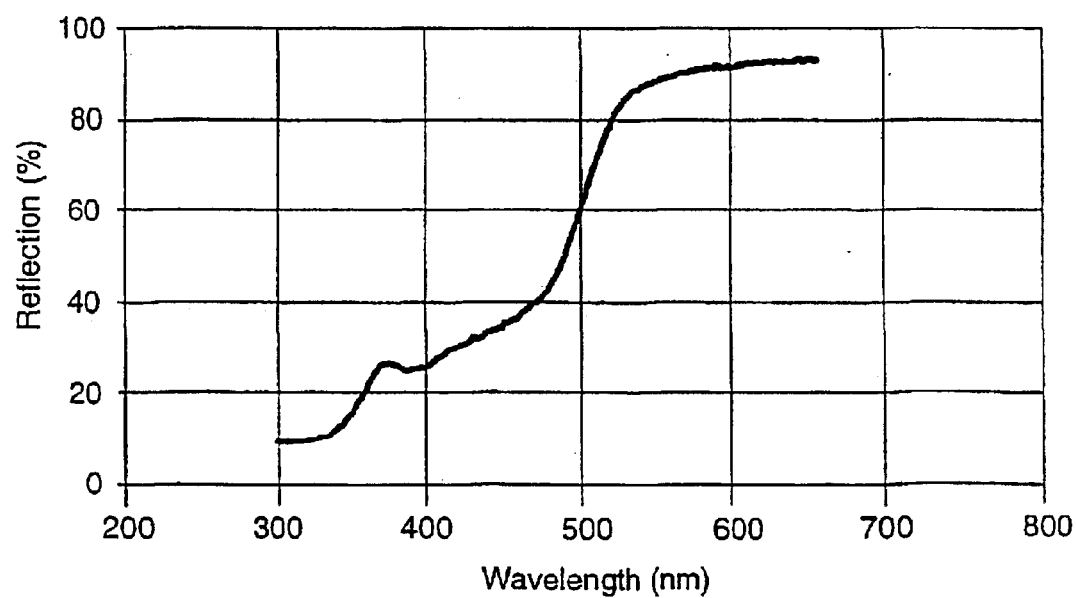

In particular further phosphors were investigated under excitation of a 400 nm LED, as summarized in Table V. By way of example, FIG. 4b shows a light source 20 having a common carrier 21. an essentially block-shaped housing is secured on it by an adhesive. The upper side of the housing 22 is formed with recesses, in which individual semiconductor elements 24 are located, preferably UV-LEDs based on InGaN with peak emission around 400 nm. Conversion into visible light, for example white light, is effected by light conversion layers 25, which are attached to all (or main part of) surfaces subject to UV-radiation from the LEDs. This includes the inner surfaces of the sidewalls of the housing 22, the bottom of the housing 22, and the cover 23. the individual LEDs may form individual pixels. Another example is a compact lamp utilizing LEDs.

The emission and reflection spectra, related to the phosphors of table V, in arbitrary units and in percent resp. as a function of the wavelength are shown in FIGS. 5 to 10.

TABLE V

| Phosphor | Peak Emission wavelength | QE | Color coordinate x | Color coordinate y | Related FIGURE |
|---|---|---|---|---|---|
| $(Mg_{0.57}Ba_{0.38}Eu_{0.05})(Ga_{1-95}Al_{0.05})S_4$ | 533 nm | 60% | 0.263 | 0.650 | 5 |
| $(Ba_{0.8}Mg_{0.15}Eu_{0.05})(Ga_{1.95}In_{0.05})S_4$ | 507 nm | 57% | 0.317 | 0.558 | 6 |
| $(Ba_{0.2}Mg_{0.6}Ca_{0.15}Eu_{0.05})Ga_2S_4$ | 535 nm | 62% | 0.297 | 0.638 | 7 |
| $(Sr_{0.09}Mg_{0.57}Eu_{0.05}Ba_{0.29})(Ga_{1-95}Y_{0.05})S_4$ | 536 nm | 63% | 0.280 | 0.679 | 8 |
| $(Sr_{0.095}Mg_{0.57}Eu_{0.05}Ca_{0.285})Ga_2S_4$ | 548 nm | 64% | 0.358 | 0.624 | 9 |
| $(Sr_{0.57}Mg_{0.285}Zn_{0.095}Eu_{0.05})Ga_2S_4$ | 532 nm | 56% | 0.274 | 0.682 | 10 |

What is claimed is:

1. A light emitting device comprising at least one LED with primary emission (peak) from 370 to 480 nm covered directly or indirectly with a phosphor-containing covering, the phosphor-containing covering comprising at least one of the following phosphors: type I: a metal sulfide photoluminescent material activated with europium containing at least one element M selected from the group consisting of Ba, Mg, and Zn;

type II: a complex thiometalate photoluminescent material activated with at least one of europium and cerium, containing 1) at least one element M* selected from the group consisting of Mg, and Zn, and 2) at least one element N* selected from the group consisting of Al, Ga, In, Y, La, Gd and wherein the type I phosphor contains in addition at least one of Ca and Sr as part of element M.

2. A light emitting device according to claim 1 wherein the type I phosphor contains Ca as part of the element M.

3. A light emitting device according to claim 1 wherein the type II phosphor contains in addition at least one of Ca, Sr and Ba as part of the element M*.

4. A light emitting device according to claim 1 wherein the emission peak of the LED is at 370 to 415 nm.

5. A light emitting device according to claim 1 wherein the emission peak of the LED is at 420 to 480 nm.

6. A light emitting device according to claim 1 wherein at least one phosphor of type I and II are combined.

7. A light emitting device according to claim 6 wherein one phosphor of type I and two phosphors of type II are combined to achieve white light.

8. A light emitting device comprising a blue emitting LED covered with a phosphor containing covering, the phosphor-containing covering containing at least one of the following phosphors: type I: a metal sulfide photoluminescent material activated with europium containing at least one element M selected from the group consisting of Ba, Mg, and Zn;

type II: a complex thiometalate photoluminescent material activated with at least one of europium and cerium, containing 1) at least one element M* selected from the group consisting of Mg, and Zn, and 2) at least one element N* selected from the group consisting of Al, Ga, In, Y, La and Gd; and wherein at least one phosphor of type I and II are combined.

9. A light emitting device according to claim 8 wherein the emission peak of the LED is at 420 to 480 nm.

10. A light emitting device according to claim 8 wherein at least two phosphors of type I and II are combined.

11. A light emitting device according to claim 8 wherein one phosphor of type I and one phosphor of type II are combined to achieve white light.

12. A light emitting device comprising a UV emitting LED covered with a phosphor containing covering, the phosphor-containing covering containing at least one of the following phosphors: type I: a metal sulfide photoluminescent material activated with europium containing at least one element M selected from the group consisting of Ba, Mg, and Zn;

type II: a complex thiometalate photoluminescent material activated with at least one of europium and cerium, containing 1) at least one element M* selected from the group consisting of Mg, and Zn, and 2) at least one element N* selected from the group consisting of Al, Ga, In, Y, La and Gd; and wherein at least one phosphor of type I and II are combined.

13. A light emitting device according to claim 12 wherein the emission peak of the LED is at 370 to 415 nm.

14. A light emitting device according to claim 12 wherein at least two phosphors of type I and II are combined.

15. A light emitting device according to claim 12 wherein one phosphor of type I and one phosphor of type II are combined to achieve white light.

16. A phosphor which absorbs radiation having a first spectrum and emits radiation having a second spectrum, the phosphor comprising: a photoluminescent metal sulfide MS (Type I phosphor) of the formula $(Sr_{1-x-y}M_xEu_y)S$ with M is at least one of Ba, Mg, Zn alone or in combination with Ca and $0<x\leq0.5$ and $0<y\leq0.10$, or a photoluminescent phosphor comprising a complex metal thiometallate photoluminescent material $M^*N^*_2S_4$ (type II phosphor) comprising of at least one element selected from the group M*=Mg, Zn, alone or in combination with at least one of Ba, Sr, Ca, and at least one element selected from the group N*=Al, Ga, alone or in combination with In, Y, La, Gd, N* being activated with at least one of europium (Eu) and cerium (Ce).

17. A phosphor composition comprising at least one of the phosphors of type I and one of the phosphors of type II in accordance with claim 16.

18. A phosphor in accordance with claim 16 wherein M is one of Ba, Mg or Zn.

19. A phosphor in accordance with claim 16 wherein the phosphor is the type I according to $(Sr_{1-x-y}M_xEu_y)S$ with M is at least one of Ba, Mg, Zn alone or in combination with Ca and $0<x\leq0.5$ and $0<y\leq0.10$.

20. A phosphor in accordance with claim 19 wherein the phosphor is according to $(Sr_{1-x-y}Ba_xEu_y)S$ with $x<0.25$.

21. A phosphor in accordance with claim 19 wherein the phosphor is according to $(Sr_{1-x-z-y}Ca_xBa_zEu_y)S$ with $x+y+z\leq0.35$.

22. A phosphor in accordance with claim 16, wherein the phosphor composition is according to $M^*N^*_2S_4$:Eu,Ce (type II phosphor) with M* is at least one of M*=Mg, Zn alone or together with at least one of Ba, Sr, Ca, and N* is at least one of N*=Al, Ga, alone or together with small proportions (below 20%) of In, Y, La, Gd.

23. A phosphor in accordance with claim 16, wherein the phosphor is of type II phosphor containing Mg as one of the host lattice elements according to $(M^{**}_{1-u}Mg_{gu})(Ga_{1-v}N^*_v)_2S_4$:Ce with $u \leq 0.75$ and $v \leq 0.10$, and $M^{}$ is at least one of $M^{}$=Ba, Sr, Ca, Zn.

24. A phosphor in accordance with claim 16, wherein the phosphor is of type II phosphor according to $(M^{**}_{1-s-t}Eu_sCe_t)(Ga_{1-v}N^*_v)_2S_4$ with $M^{**}$ is at least one of =Mg, Zn alone or in combination with Sr, Ba, Ca, and $N^*$=Al, In, Y, La, Gd and $0<s \leq 0.10$ and $0 \leq t:s<0.2$ with $v \leq 0.10$.

25. A phosphor in accordance with claim 16, wherein the phosphor is of type II phosphor according to $((Ba_{1-u}Mg_u)_{1-s-t}Eu_sCe_t)(Ga_{1-v}N^*_v)_2S_4$ with $u \leq 0.75$ and $v \leq 0.10$ and $0<s \leq 0.10$ and $0 \leq t:s<0.2$.

26. A phosphor in accordance with claim 16, wherein the phosphor is of type II phosphor according to $(((Ba_{1-w}Ca_w)_{1-u}Mg_u)_{1-s-t}Eu_sCe_t)(Ga_{1-v}N^*_v)_2S_4$ with $u \leq 0.75$ and $w \geq 0.10$ and $v \leq 0.10$ and $0<s \leq 0.10$ and $0 \leq t:s<0.2$.

27. A phosphor in accordance with claim 16, wherein the phosphor is of type II phosphor according to $(((Ba_{1-r}Sr_r)_{1-u}Mg_u)_{1-s-t}Eu_sCe_t)(Ga_{1-v}N^*_v)_2S_4$ with $u<0.75$ and $r \geq 0.10$ and $v \leq 0.10$ and $0<s \leq 0.10$ and $0 \leq t:s<0.2$.

28. A phosphor in accordance with claim 16, wherein the phosphor is of type II phosphor according to $(((Sr_{1-w}Ca_w)_{1-u}Mg_u)_{1-s-t}Eu_sCe_t)(Ga_{1-v}N^*_v)_2S_4$ with $u \leq 0.75$ and $w \geq 0.10$ and $v \leq 0.10$ and $0<s \leq 0.10$ and $t:s<0.2$.

29. A phosphor in accordance with claim 16, wherein the phosphor is of type II phosphor according to $(((Sr_{1-p}Zn_p)_{1-u}Mg_u)_{1-s-t}Eu_sCe_t)(Ga_{1-v}N^*_v)_2S_4$ with $u<0.75$ and $p \leq 0.35$ and $v \leq 0.10$ and $0<s \leq 0.10$ and $0 \geq t:s<0.2$.

* * * * *